(12) United States Patent
Lin et al.

(10) Patent No.: US 6,363,012 B1
(45) Date of Patent: Mar. 26, 2002

(54) METHOD FOR IMPROVED PROGRAMMING EFFICIENCY IN FLASH MEMORY CELLS

(75) Inventors: Shi-Tron Lin, Taipei (TW); William W. Y. Lee, Palo Alto, CA (US)

(73) Assignee: Winbond Electronics Corporation, Hsinchu (TW)

(*) Notice: Subject to any disclaimer, the term of this patent is extended or adjusted under 35 U.S.C. 154(b) by 0 days.

(21) Appl. No.: 09/472,861

(22) Filed: Dec. 27, 1999

(51) Int. Cl.[7] .............................................. G11C 16/04
(52) U.S. Cl. .............................. 365/185.18; 365/185.27
(58) Field of Search ........................ 365/185.18, 185.27

(56) References Cited

U.S. PATENT DOCUMENTS

| | | | |
|---|---|---|---|
| 3,851,280 A | * 11/1974 | Staples | ........................ 357/26 |
| 5,029,130 A | 7/1991 | Yeh | |
| 5,280,446 A | 1/1994 | Ma et al. | |
| 5,346,842 A | 9/1994 | Bergemont | |
| 5,621,689 A | * 4/1997 | Sakakibara et al. | .... 365/185.26 |
| 5,644,532 A | 7/1997 | Chang | |
| 5,659,504 A | 8/1997 | Bude et al. | |
| 5,703,808 A | 12/1997 | Makwana et al. | |
| 5,742,541 A | * 4/1998 | Tanigami et al. | ........ 365/185.3 |
| 5,818,761 A | * 10/1998 | Onakado et al. | ....... 365/185.18 |
| 5,838,617 A | 11/1998 | Bude et al. | |

* cited by examiner

Primary Examiner—Richard Elms
Assistant Examiner—VanThu Nguyen
(74) Attorney, Agent, or Firm—Townsend and Townsend and Crew LLP

(57) ABSTRACT

A method of operating a flash memory structure including a programming step. The method includes providing a flash memory device, the flash memory device comprising a substrate of first conductivity type, a source region of second conductivity type being defined in the substrate and a drain region of second conductivity type defined in the substrate. The flash memory device can be a split gate, a stacked gate, or other type of physical structure. The method includes applying a drain voltage of first polarity type on the drain region and applying a control gate voltage of a first conductivity type on the control gate. The method also includes applying a source voltage of second polarity type ranging from about 0.1 volt to about 0.5 volt on the source region, while maintaining a ground potential on the substrate to inject electrons onto a floating gate to program the floating gate.

26 Claims, 8 Drawing Sheets

METHOD FOR IMPROVED PROGRAMMING EFFICIENCY IN FLASH MEMORY CELLS

The present invention relates to semiconductor integrated circuits and their manufacture. The invention is illustrated in an example with regard to the operation of a "flash" electrically-erasable programmable read only memory ("Flash EEPROM") cell, but it will be recognized that the invention has a wider range of applicability. Merely by way of example, the invention may be applied in the manufacture of other semiconductor devices such as micro controllers, microprocessors, application specific integrated circuits, embedded memory applications, among others.

Industry has used or proposed a variety of memory devices. An example of such a memory device is an erasable programmable read-only memory ("EPROM") device. The EPROM device is readable, writeable, and erasable, i.e., programmable. The EPROM is implemented using a floating gate field effect transistor, which has certain binary states. That is, a binary state is represented by the presence or absence of charge on the floating gate. The charge is generally sufficient to prevent conduction even when a normal high signal is applied to the gate of the EPROM transistor.

A wide variety of EPROMs is available. In a traditional form, EPROMs are programmed electrically and erased by exposure to ultraviolet light. These EPROMs are commonly referred to as ultraviolet erasable programmable read-only memories ("UVEPROMs"). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate where charge is accumulated.

Another form of EPROM is the electrically erasable programmable read-only memory ("EEPROM" or "E²PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

The programming of flash memory cells typically takes at least a few micro seconds, which is slow when compared to some memory cells which operate at hundreds of times faster speed. This relatively slow programming speed of the flash memory cells is particularly problematic in a large recording devices, such as, voice or digital image recording devices, that uses flash EEPROM memories. Therefore, improvement in the programming speed of the flash memory cells is desirable.

SUMMARY OF THE INVENTION

According to the present invention, a technique including a method and device for operating a flash memory cell is provided. In an exemplary embodiment, the present invention provides a method of programming a flash memory device that enhances programming efficiency using a hot carrier injection process.

In a specific embodiment, the present invention provides a method of operating a flash memory structure including a programming step. The method includes providing a flash memory device. The flash memory device has a substrate of first conductivity type, a source region of second conductivity type defined in the substrate and a drain region of second conductivity type defined in the substrate. The flash memory device can be a split gate, a stacked gate, or other type of physical structure. The method includes applying a drain voltage of a first polarity type ranging from about 4 to about 12 volts on the drain region and applying a control gate voltage of first polarity type ranging from about 1.5 to about 2 volts on a control gate. The method also includes applying a source voltage of second polarity type ranging from about −0.2 volt to about −0.5 volt on the source region, while maintaining a ground potential on the substrate to inject electrons onto a floating gate, which is coupled to the control gate, to program the floating gate to a logic state.

In an alternative embodiment, the present invention provides a method of programming a flash memory structure. The method includes providing a flash memory device. The flash memory device has a substrate of second conductivity type and a well of first conductivity type region defined in the substrate of second conductivity type. A drain region of second conductivity type is defined in the well region and a source region of second conductivity type is defined in the well region. Selected voltages are applied to program the device. Here, the method includes applying a drain voltage of first polarity type ranging from about 4 to about 12 volts on the drain region and applying a control gate voltage of first polarity type ranging from about 1.5 to about 10 volts on a control gate.

In a further embodiment, the present invention provides a method for programming a flash memory device in a memory array. The memory array comprises a plurality of flash memory devices, each of the devices is coupled to a column address decoder and a row address decoder. Each of the devices also coupled to a source bias line, which is coupled to a bias potential generation circuit. The bias potential generation circuit is coupled to the source bias line through a logic circuit. Each flash memory device includes a substrate of first conductivity type, a source region of second conductivity type defined in the substrate and a drain region of second conductivity type defined in the substrate. The method comprises selectively applying a drain voltage of first polarity type ranging from about 4 to about 12 volts on the drain region and applying a control gate voltage of first polarity type ranging from about 1.5 to about 2 volts on a control gate of at least one of the flash memory devices. A source voltage of second polarity type ranging from about 0.2 volt to about 0.5 volt is applied on the source region on the one flash memory device, while maintaining a ground potential on the P-type substrate to inject electrons onto a floating gate to program the floating gate. The source voltage is applied by the bias-potential generation circuit coupled to the source region. The bias-potential generation circuit couples to the source region through the source-bias line.

Numerous benefits are achieved by way of the present method of operating the flash memory cells, and may include one or more of the following advantages. In one implementation, the present invention improves programming efficiency. The present invention is easy to achieve and can be implemented on a variety of physical structures such as stacked gate, split gate, and other structures. The present invention lowers of the threshold voltage of the flash memory cell. The present invention increases programming speed. The present invention achieves one or more of these benefits in one or more embodiments. These and other benefits, however, will be discussed in more detail below.

The present invention achieves these benefits in the context of known proces s technology. However, a further understanding of the nature and advantages of the present invention may be realized by reference to the latter portions of the specification and attached drawings.

DETAILED DESCRIPTION OF THE SPECIFIC

According to the present invention, a technique including a method and device for operating a flash memory cell is provided. In an exemplary embodiment, the present invention provides a method of programming a flash memory device that enhances programming efficiency using a hot carrier injection process. Details of the programming method are provided below.

Figure 1:
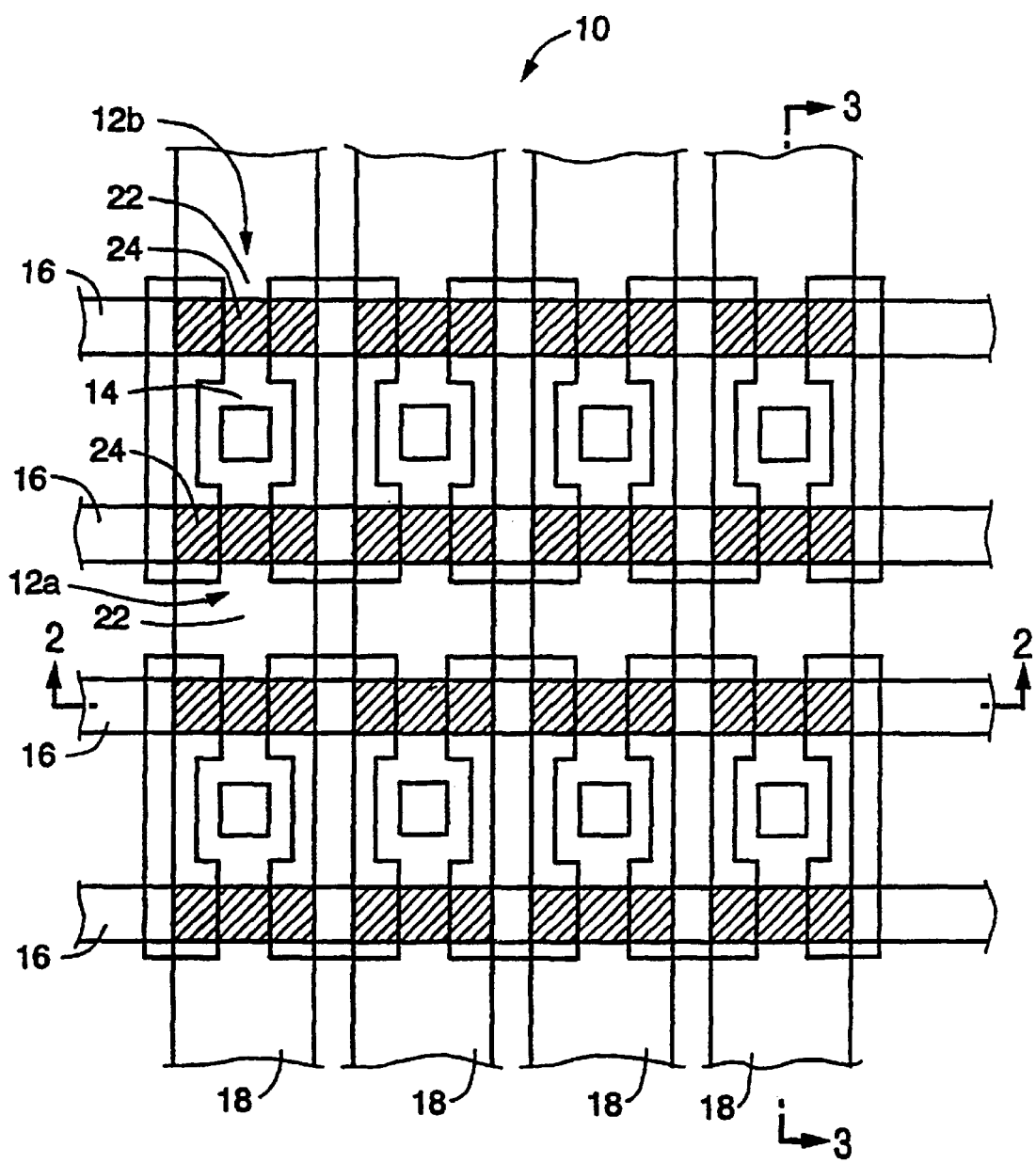
FIGS. 1 to 4 are simplified diagrams of ETOX flash memory cell structures for which the programming method of the present invention can apply.
Figure 2:
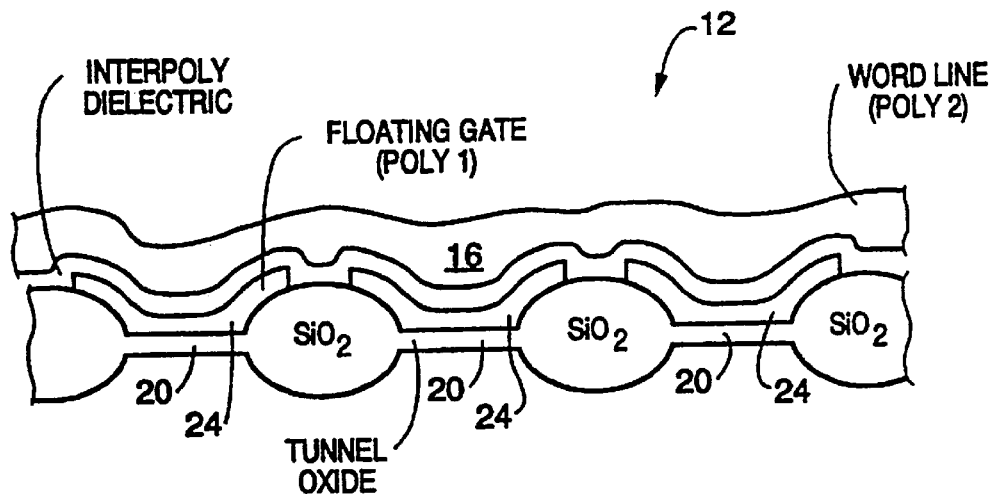
Figure 3:
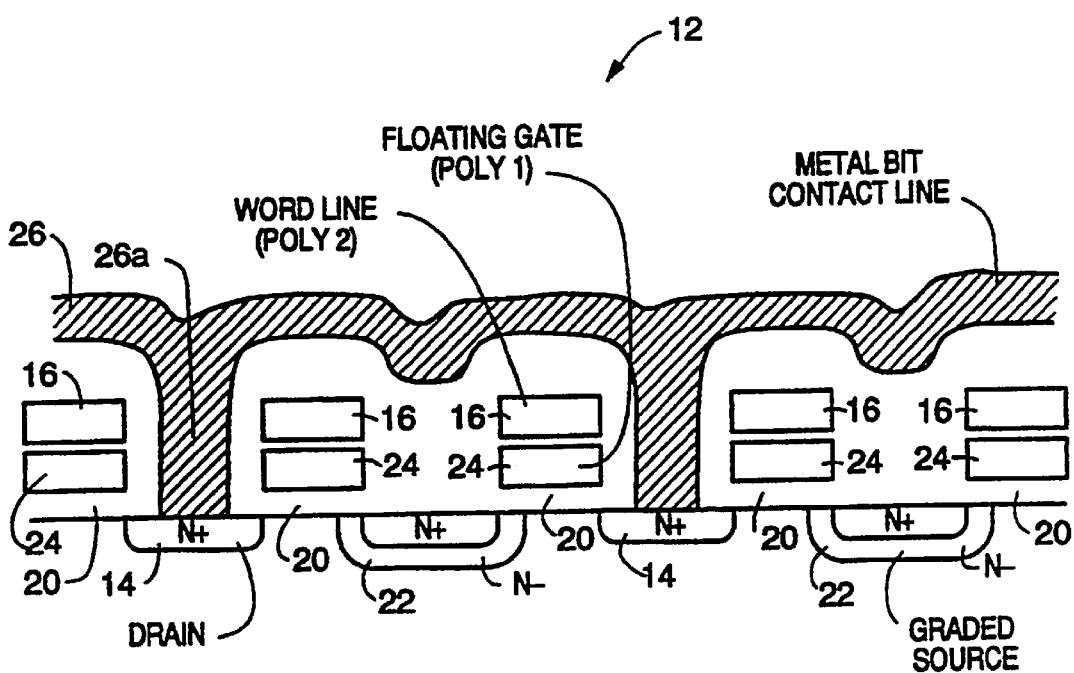

FIGS. 1 to 4 are simplified diagrams of ETOX flash memory cell structures for which the programming method of the present invention can apply. These diagrams are merely examples and should not limit the scope of the claims herein. One of ordinary skill in the art would recognize other alternatives, variations, and modifications. FIG. 1 shows a simplified portion of an ETOX EPROM array 10. The array includes two ETOX cells 12a and 12b that share one drain contact 14. FIG. 2 shows a simplified cross-section of an individual ETOX cell 12 taken along line 2—2 (i.e. along polysilicon (poly 2) word line 16) in FIG. 1. FIG. 3 shows a cross-section of an ETOX cell 12 taken along line 3—3 (i.e. along buried N+bit line 18) in FIG. 1. The ETOX array 10 is based on the standard "T-shaped" ETOX cell. As shown in FIGS. 2 and 3, the ETOX cell 12 is implemented utilizing a thin gate oxide 20 (about 100 Angstrom and less) and graded N+/N—source regions 22 to prevent disturbances due to band-to-band tunneling when the cell 12 is being erased. The ETOX cell can be implemented in a P-type impurity substrate or P-well such as the embodiment in FIG. 4A or FIG. 4B. The present invention can be better understood by way of showing the operation of the ETOX cell using the Figs. below.

Figure 4A:
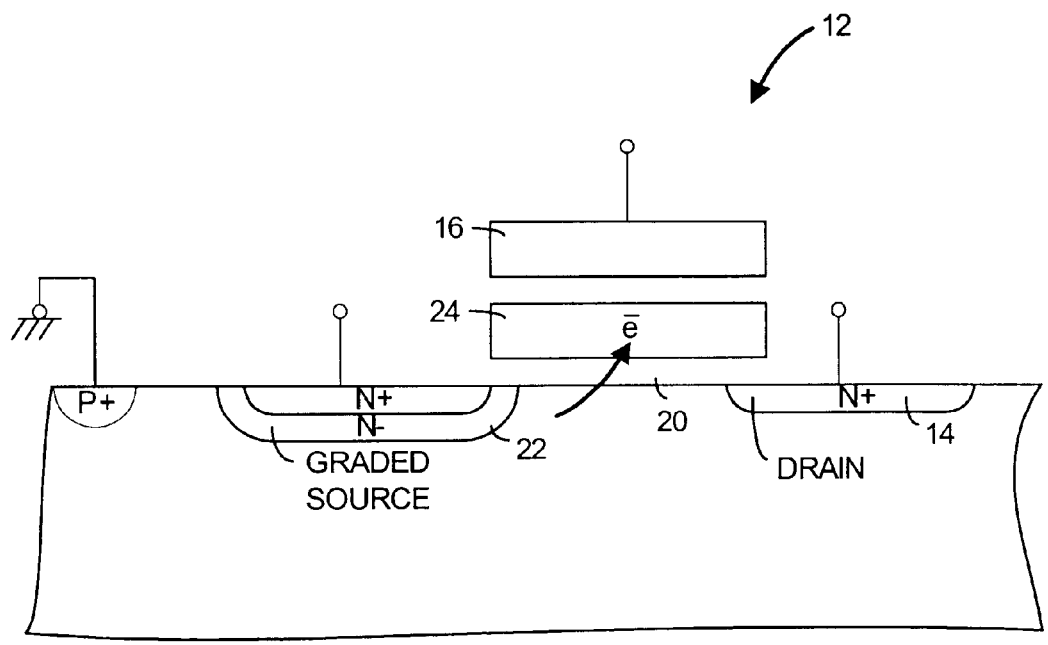

As shown in FIG. 4A, the ETOX cell can be written in a variety of ways. In one aspect, the EPROM relies upon hot electrons. That is, hot electrons are injected from the graded source region 22 into the polysilicon (poly 1) floating gate 24 when the poly 2 word line 16 and the N+bit line (drain) 14 are both high, as shown in Table 1 below, which is for a device having a 0.6µ design rule. Preferably, the source voltage is provided a level below a ground state.

TABLE 1

ETOX PROGRAMMING VOLTAGES

| ELEMENT | CONVENTIONAL | METHOD 1 |
|---|---|---|
| V (DRAIN) | 6 TO 7 Volts | 6 TO 7 Volts |
| V (CG) | 8 TO 12 Volts | 8 TO 12 Volts |
| V (SOURCE) | 0 | −0.3Volt |
| V (PWELL/PSUB) | 0 | 0 |

Table 1 shows conventional voltages, and voltages according to the present invention, which includes Method 1. In method 1, the forward-biased source-to-substrate reduces the threshold voltage and increases the channel electrons during programming, hence increasing the programming efficiency.

Figure 4B:
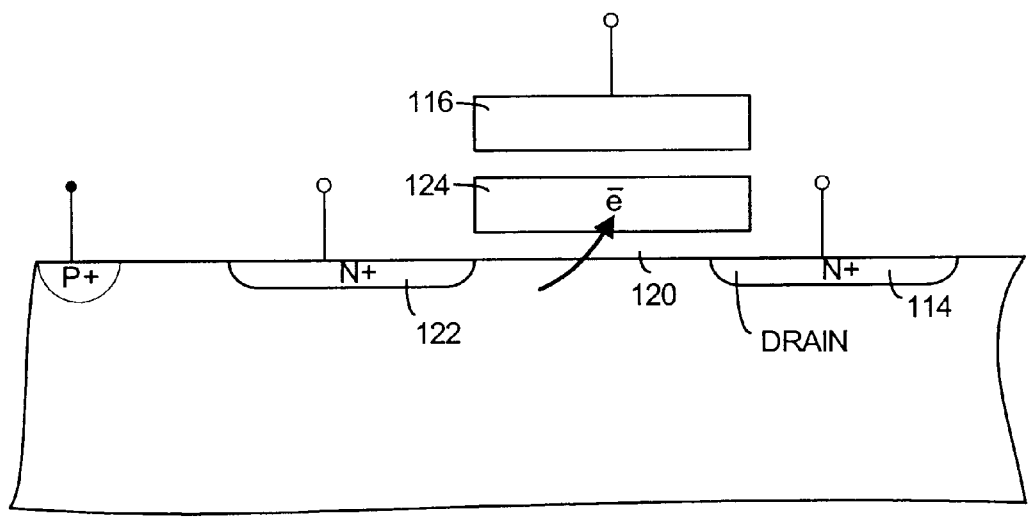

As shown in FIG. 4B, the ETOX cell can be written in a unique way called channel-initiated secondary electron injection (CHISEL or CISEI), described in U.S. Pat. Nos. 5,659,504 and 5,838,617, which are incorporated herein by reference. In one aspect, the EPROM relies upon secondary hot electrons. That is, hot electrons are injected from the source region 122 into the polysilicon (poly 1) floating gate 124 when the poly 2 word line 116 and the N+bit line (drain) 114 are both high, as shown in Table 2 below, which is for a device having a 0.35 µm design rule.

TABLE 2

CHISEL PROGRAMMING VOLTAGES

| ELEMENT | CONVENTIONAL | METHOD 2 |
|---|---|---|
| V (DRAIN) | 1.1 TO 3.3 Volts | 1.1 TO 3.3 Volts |
| V (CG) | 3 TO 5 Volts | 3 TO 5 Volts |
| V (SOURCE) | 0 | V (PWELL)-Delta V |
| V (PWELL/PSUB) | −0.5 TO −4 Volts | −0.5 TO −4 Volts |

Table 2 shows conventional voltages, and voltages according to the present invention, i.e., Method 2 for a CHISEL cell. In Method 2, the source is applied with a potential that is slightly more negative (by delta voltage) than that of the P-well during programming operation to obtain a slight negative source-to-P-well bias, i.e., to forward bias the source-to-P-well junction. The delta voltage can be in the range of 0.01 to 0.65 volts inclusive, preferably from 0.2 to 0.5 volts. The forward-biased source-to-P-well reduces the threshold voltage and increases the channel current and hence secondary hot electrons during programming. This increases the programming speed since the programming speed is proportional to the channel current $I_D$. The channel current, in turn, is proportional to $(V_{FG}-V_T)^2$ during programming, where $V_{FG}$ is the potential of the floating gate and $V_T$ the threshold voltage. Therefore, reducing the threshold voltage by forward biasing the source-to-P-well junction can significantly increase the program speed.

Figure 5:
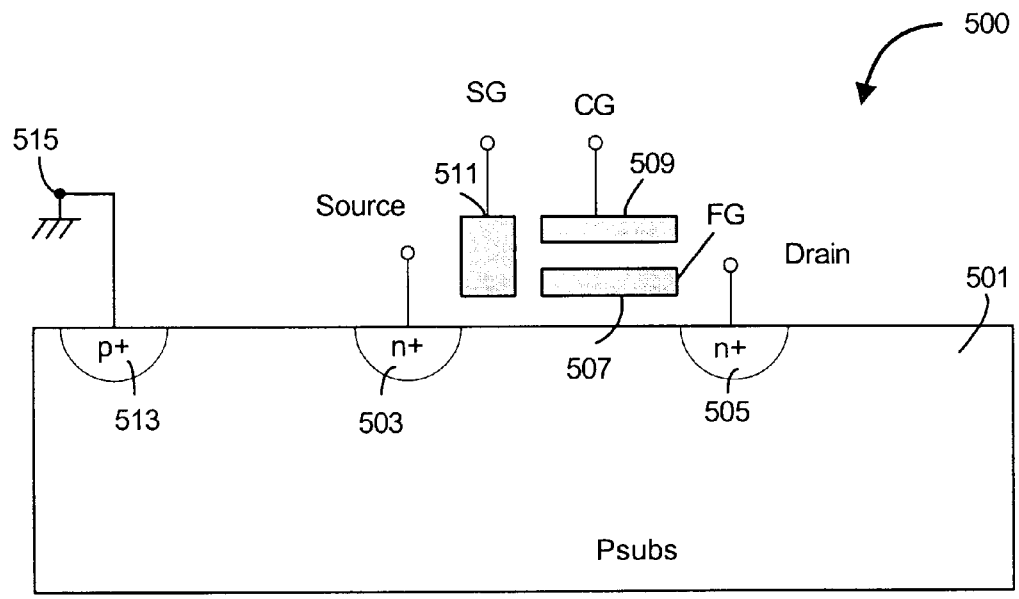
FIGS. 5 and 6 are simplified diagrams of split gate flash memory cell structures for which the programming method of the present invention can apply.
Figure 6:
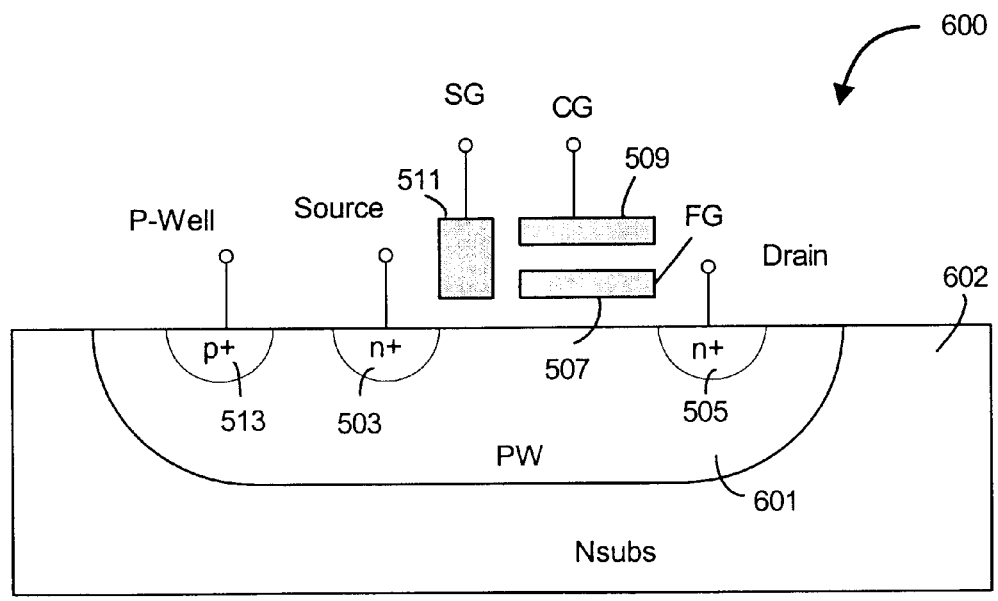

FIGS. 5 and 6 are simplified diagrams of split gate flash memory cell for which the programming method of the present invention can apply. These diagrams are merely examples and should not limit the scope of the claims herein. One of ordinary skill in the art would recognize other alternatives, variations, and modifications. FIG. 5 shows a split-gate flash EEPROM memory structure 500 on a P-type substrate 501. The P-type substrate includes a variety of features such as a source region 503, a drain region 505, which are diffused into the substrate. In most cases, the source and drain regions are provided by way of ion implantation or other suitable techniques. The substrate also includes isolation structures such as field isolation oxide region, which can be in the form of a local oxidation of silicon or trench isolation structures (not shown). The substrate can also include lightly doped structures, such as lightly doped drains and other metal oxide silicon structures.

The memory structure also includes a split gate structure. The split gate structure includes among other elements a floating gate 507, which is overlying a layer of dielectric material overlying a channel region in the substrate. The dielectric layer can be any suitable material such as high quality silicon dioxide, silicon nitride, a combination thereof, and others. In the present embodiment, the channel region has a length of about 0.6 micron and less. Alternatively, the channel length can be about 1.0 micron and less. The floating gate is often made of a suitable conductive material such as doped polysilicon and others.

A control gate 509 is defined overlying the floating gate. The control gate layer is made by a suitable conducting material such as doped polysilicon and others. The control gate layer can also have an overlying refractory metal layer, which can improve conductivity. The control gate and floating gate often have a dielectric layer or layers sandwiched in between these layers. As merely an example, the dielectric layers are often an oxide layer, a nitride layer overlying the oxide layer, and a nitride layer overlying the oxide layer, which forms a sandwiched layer commonly called "ONO." Other types of layer can also be used, however.

A select gate 511 is defined adjacent to the floating and control gate structure. The select gate is often made of a suitable conductive materials such as heavily doped polysilicon, but can be others. The select gate has an edge near the source region and is adjacent to an edge of the control and floating gates. The select gate, however, is insulated and isolated from the control and floating gates by way of an insulating layer defined between the edge of the select gate and edge of the control and floating gates.

FIG. 6 shows a similar structure 600 to the flash memory cell of the above Fig. Here, the flash memory cell 600 is defined in a P-type well 601 in an N-type substrate 602. Like reference numerals are used in the present Fig. as the previous Fig. for easy reading. The N-type substrate 602 includes a variety of features such as a source region 503, a drain region 505, which are diffused into the P-type well of the N-type substrate. In most cases, the source and drain regions are provided by way of ion implantation or other suitable techniques. The substrate also includes isolation structures such as field isolation oxide region, which can be in the form of a local oxidation of silicon or trench isolation structures (not shown). The substrate can also include lightly doped structures, such as lightly doped drains and other metal oxide silicon structures.

The memory structure also includes a split gate structure. The split gate structure includes among other elements a floating gate 507, which is overlying a layer of dielectric material overlying a channel region in the substrate. The dielectric layer can be any suitable material such as high quality silicon dioxide, silicon nitride, a combination thereof, and others. The floating gate is often made of a suitable conductive material such as doped polysilicon and others.

A control gate 509 is defined overlying the floating gate. The control gate layer is made by a suitable conducting material such as doped polysilicon and others. The control gate layer can also have an overlying refractory metal layer, which can improve conductivity. The control gate and floating gate often have a dielectric layer or layers sandwiched in between these layers. As merely an example, the dielectric layers are often an oxide layer, a nitride layer overlying the oxide layer, and a nitride layer overlying the oxide layer, which forms a sandwiched layer commonly called "ONO." Other types of layer can also be used, however.

A select gate 511 is defined adjacent to the floating and control gate structure. The select gate is often made of a suitable conductive materials such as heavily doped polysilicon, but can be others. The select gate has an edge near the source region and is adjacent to an edge of the control and floating gates. The select gate, however, is insulated and isolated from the control and floating gates by way of an insulating layer defined between the edge of the select gate and edge of the control and floating gates.

To program the device, selected voltages are applied to the elements of the flash memory devices in the above Figs. Table 3 provides examples of some of these voltages. The voltages are shown as Method 3A, which are often for devices using a $0.6\mu$ design rule, but can be others.

TABLE 3

SPLIT GATE PROGRAMMING VOLTAGES

| ELEMENT | CONVENTIONAL | METHOD 3 |
| --- | --- | --- |
| V (DRAIN) | 5 Volts | 5 Volts |
| V (CG) | 12 Volts | 12 Volts |
| V (SG) | 1.8 Volts | 1.8 Volts |
| V (SOURCE) | 0 | −0.3 Volt |
| V (PWELL/PSUB) | 0 | 0 |

In Method 3, a forward-biased source-to-substrate or source-to-P-type well potential can reduce a threshold voltage of the device since the channel current is proportional to $(V_{SG}-V_T)^2$, where $V_{SG}$ is the potential of the select gate and $V_T$ is the threshold voltage. For example, if threshold voltage is reduced by about 0.5V, the channel current is increased by a factor of 2.25, as compared to conventional techniques. Also, programming efficiency also increases by 125%, as compared to conventional techniques, as well as other features.

Figure 7:
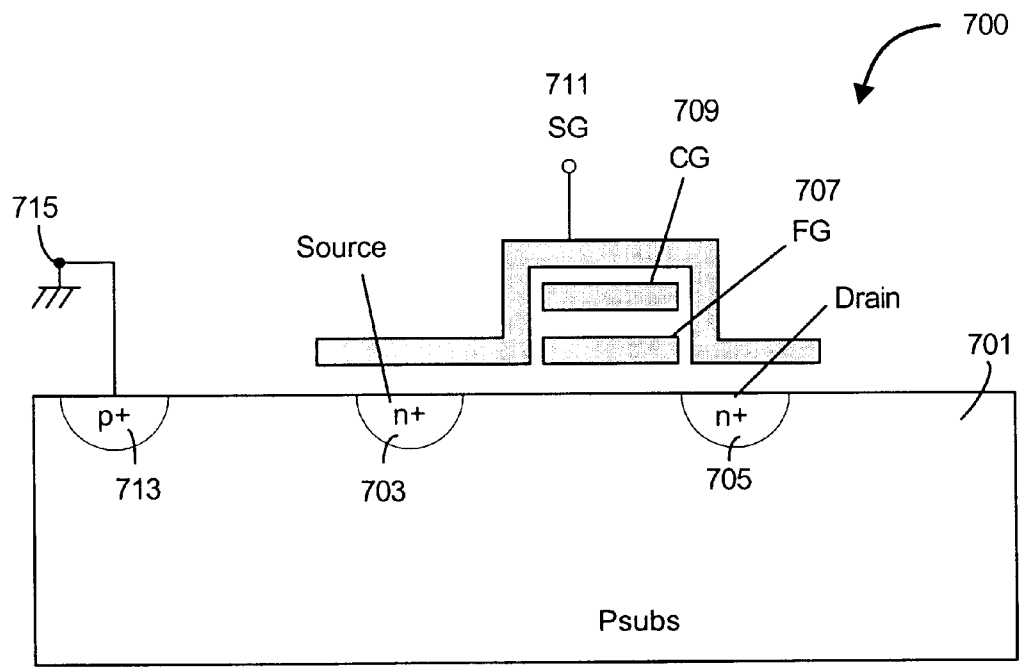
FIG. 7 is simplified diagram of alternative split gate flash memory cell structures for which the programming method of the present invention can apply.

FIG. 7 is a simplified diagram of alternative split gate flash memory for which the programming method of the present invention can apply. This diagrams is provided merely as an example and should not limit the scope of the claims herein. One of ordinary skill in the art would recognize other alternatives, variations, and modifications. FIG. 7 shows a split-gate flash EEPROM memory structure 700 on a P-type substrate 701. The P-type substrate includes a variety of features such as a source region 703, a drain region 705, which are diffused into the substrate. In most cases, the source and drain regions are provided by way of ion implantation or other suitable techniques. The substrate also includes isolation structures such as field isolation oxide region, which can be in the form of a local oxidation of silicon or trench isolation structures (not shown). The substrate can also include lightly doped structures, such as lightly doped drains and other metal oxide silicon structures.

The memory structure also includes a split gate structure. The split gate structure includes among other elements a floating gate 707, which is overlying a layer of dielectric material overlying a channel region in the substrate. The dielectric layer can be any suitable material such as high quality silicon dioxide, silicon nitride, a combination thereof, and others. The floating gate is often made of a suitable conductive material such as doped polysilicon and others.

A control gate 709 is defined overlying the floating gate. The control gate layer is made by a suitable conducting material such as doped polysilicon and others. The control gate layer can also have an overlying refractory metal layer, which can improve conductivity. The control gate and floating gate often have a dielectric layer or layers sandwiched in between these layers. As merely an example, the dielectric layers are often an oxide layer, a nitride layer overlying the oxide layer, and a nitride layer overlying the oxide layer, which forms a sandwiched layer commonly called "ONO." Other types of layer can also be used, however.

A select gate 711 is defined overlying to the floating and control gate structure, including edges of this structure. The select gate also overlies the source and drain regions. The select gate is often made of a suitable conductive materials such as heavily doped polysilicon, but can be others. The select gate is insulated and isolated from the control and floating gates by way of an insulating layer defined between the select gate and the control and floating gates. Addition of a select gate in the FIG. 7 structure, when coupled with the programming method of the present invention, has an additional advantage of minimizing programming disturb.

Figure 8:
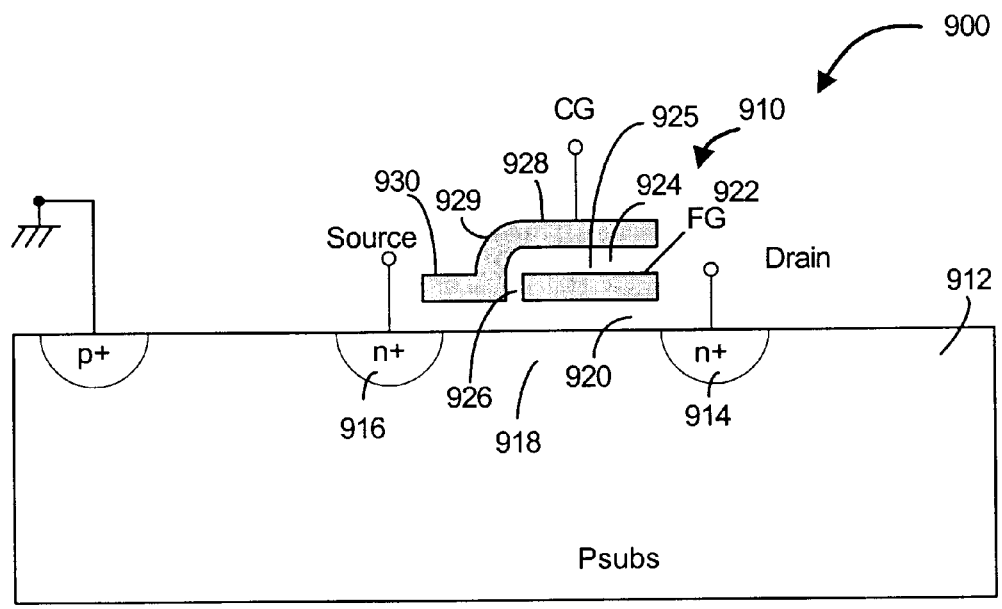
FIG. 8 is simplified diagram of alternative split gate flash memory cell structures for which the programming method of the present invention can apply.

FIG. 8 is a simplified diagram of alternative split gate flash memory cell structures 900, 1000 for which the programming method of the present invention can apply. This diagram provided merely as an example and should not limit the scope of the claims herein. One of ordinary skill in the art would recognize other alternatives, variations, and modifications. Referring to FIG. 8, there is shown a single transistor non-volatile electrically alterable semiconductor memory cell 910. The cell 910 comprises semiconductor substrate 912, such as silicon. The substrate 912, in one embodiment, can be a P-type silicon substrate with a typical doping level range from 5 to 50 ohm-cm, depending on the level of scaling.

Within the substrate 912 are defined source region 916 and drain region 914 with a channel region 918 therebetween. Disposed over the source region 916, channel region 918, and drain region 914 is a first layer 920 of insulating material, on the order of 100 angstrom of thickness. The first layer 920 can be an insulating material made from silicon dioxide, silicon nitride or silicon oxynitride. Disposed over the first layer 920 is a floating gate 922. The floating gate 922 is positioned over a portion of the channel region 918 and over a portion of the drain region 914. The floating gate 922 can be a polysilicon gate and in one embodiment is a re-crystallized polysilicon gate. A second insulating layer 925 has a first portion 924 disposed over the floating gate 922 and a second portion 926 disposed adjacent to the floating gate 922. The first portion 924 of the second layer 925 is an insulating material and can be silicon dioxide, silicon nitride or silicon oxynitride and is on the order of 100 angstrom in thickness. The second portion 926 (side wall 926) of the second layer 925 is also of an insulating material and can be silicon dioxide, silicon nitride or silicon oxynitride. A control gate 929 has two portions: A first portion 928 is disposed over the top wall 924 of the second layer 925; a second portion 930 is disposed over the first layer 920 and is immediately adjacent to the side wall 926 of the second layer 925. The second portion 930 of the control gate 929 extends over a portion of the source region 916 and over a portion of the channel region 918.

The dimensions of the cell 910 depend upon the process used. Thus, the foregoing dimensions for the first layer 920, sidewall 926, and top wall 924 are only illustrative examples. Further, the material for the first layer 920 and the second layer 925 are also illustrative examples only. In general, that electrons emanating from the source region 916 are injected onto the floating gate 922 by sensing an abrupt potential drop. (The specific mechanism of the theory of operation of the cell 910 will be explained in greater detail hereinafter.) Further, the dimensions of cell 910 should be such that charges from the floating gate 922 are removed by tunneling through the Fowler-Nordheim mechanism through the second layer 925 onto the control gate 929. The particular manner of operating the cell 910 is as follows:

TABLE 4

SPLIT GATE PROGRAMMING VOLTAGES

| ELEMENT | CONVENTIONAL | METHOD 4 |
| --- | --- | --- |
| V (DRAIN) | 12 Volts | 12 Volts |
| V (CG) | 2 Volts | 2 Volts |
| V (SOURCE) | 0 | −0.3 Volt |
| V (PWELL/PSUB) | 0 | 0 |

Initially, when it is desired to erase cell 910, a ground potential is applied to the drain 914 and to the source 916. A high-positive voltage, on the order of +15 volts, is applied to the control gate 929. Charges on the floating gate 922 are induced through the Fowler-Nordheim tunneling mechanism to tunnel through the second layer 925 to the control gate 929, leaving the floating gate 922 positively charged. By way of Fowler-Nordheim tunneling, the split gate cell is erased.

In a read cycle, ground potential is applied to the source region 916. Conventional transistor read voltage, such as +2 volts and +5 volts, are applied to the drain region 914 and to the control gate 929, respectively. If the floating gate 922 is positively charged (i.e., the floating gate is discharged), then the channel region 918 directly beneath the floating gate 922 is turned on. When the control gate 929 is raised to the read potential, the region of the channel region 918 directly beneath the second portion 930 is also turned on. Thus, the entire channel region 918 will be turned on, causing electrical current to flow from the drain region 914 to the source region 916. This would be the "1" state.

Alternatively, if the floating gate 922 is negatively charged, the channel region 918 directly beneath the floating gate 922 is either weakly turned on or is entirely shut off. Even when the control gate 929 and the drain region 914 are raised to the read potential, little or no current will flow through the portion of the channel region 918 directly beneath the floating gate 922. In this case, either the current is very small compared to that of the "1" state or there is no current at all. In this manner, the cell 910 is sensed to be programmed at the "0" state.

Figure 9:
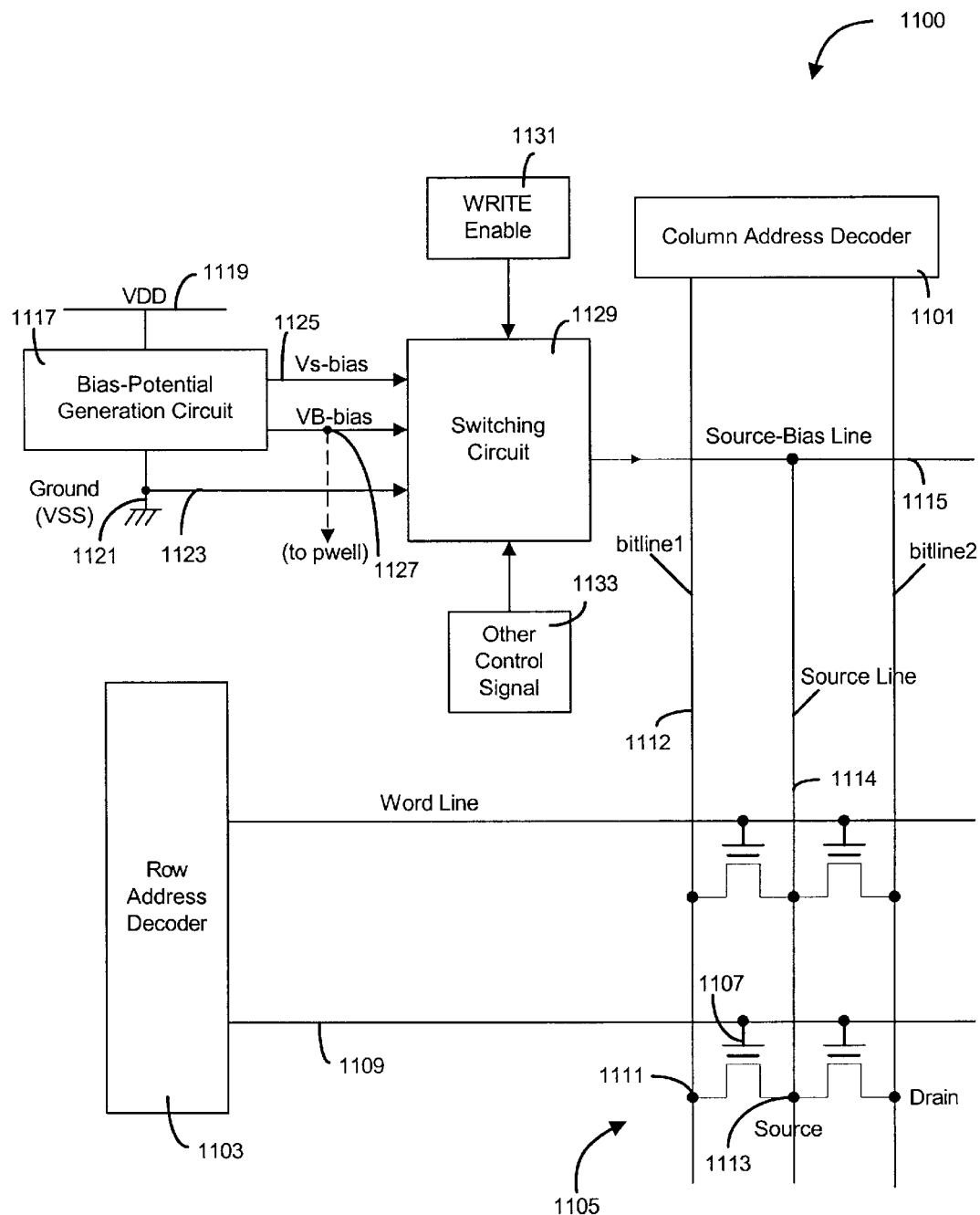
FIGS. 9 to 11 are simplified circuit diagrams according to embodiments of the present invention.
Figure 11:
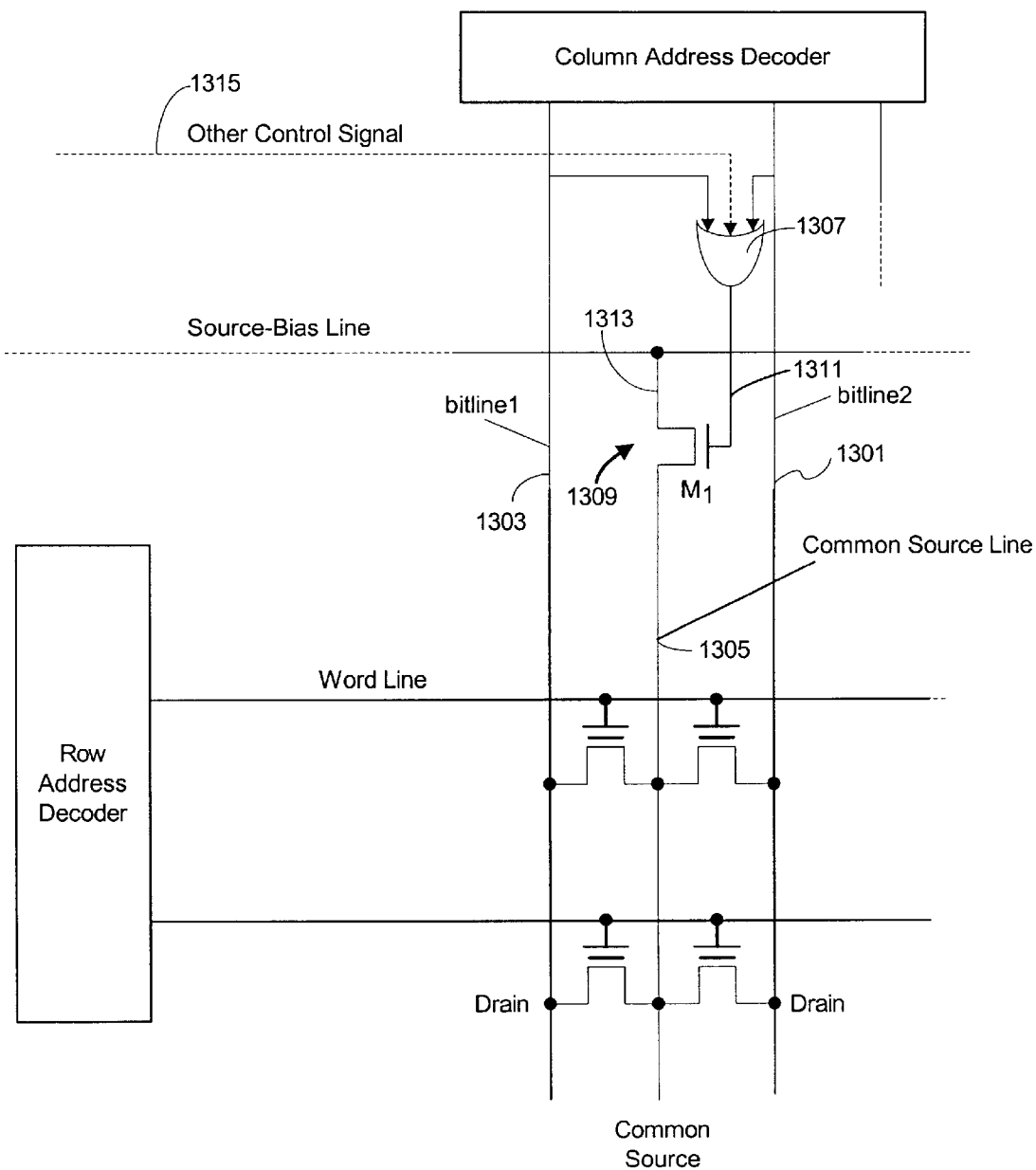

FIGS. 9 and 11 are simplified circuit diagrams according to embodiments of the present invention. These diagrams are merely examples which should not limit the scope of the claims herein. One of ordinary skill in the art would recognize many other variations, modifications, and alternatives. As shown in FIG. 9, memory array 1100 is addressed by row 1103 and column 1101 address decoders. The memory array includes a plurality of memory cells 1105. Each memory cell can be any of the ones noted as well as others. Each memory cell has a gate 1107 connected to a word line 1109, which couples to the row address decoder. A drain 1111 is connected to a bit line 1112, which couples to the column address decoder. A source 1113 is connected to a source line 111, which couples to a source-bias line. In the present embodiment, the source-bias line is common to each of the cells in the array. Alternatively, it may be common to a plurality of cells in an array segment or the like.

The source-bias line couples to a bias-potential generator 1117. The bias-potential generator generates Vs-bias 1125. The generator can also generate a VB (bulk, psubs or pwell) bias 1127. The generator couples to a VDD 1119 and a ground VSS 1121. The generator couples to the array through a switching circuit 1129, which determines the potential of the source-bias line, based on a WRITE enable signal 1131. The potential can include the Vs-bias, the VB bias, or the ground (VSS) potential to be applied to the source-bias line. Alternatively, the potential of the source-bias line can be controlled by the logic operation of a WRITE enable signal and another control signal(s) 1133. The switching circuit also couples to ground 1121 via line 1123. According to the present invention, the Vs-bias can be at a potential of V(psubs)−Delta__V, for a Delta__V of less than 0.65V, and preferably in the range of 0.2 to 0.5V, which is applied to source-bias line for programming purposes.

Figure 10:
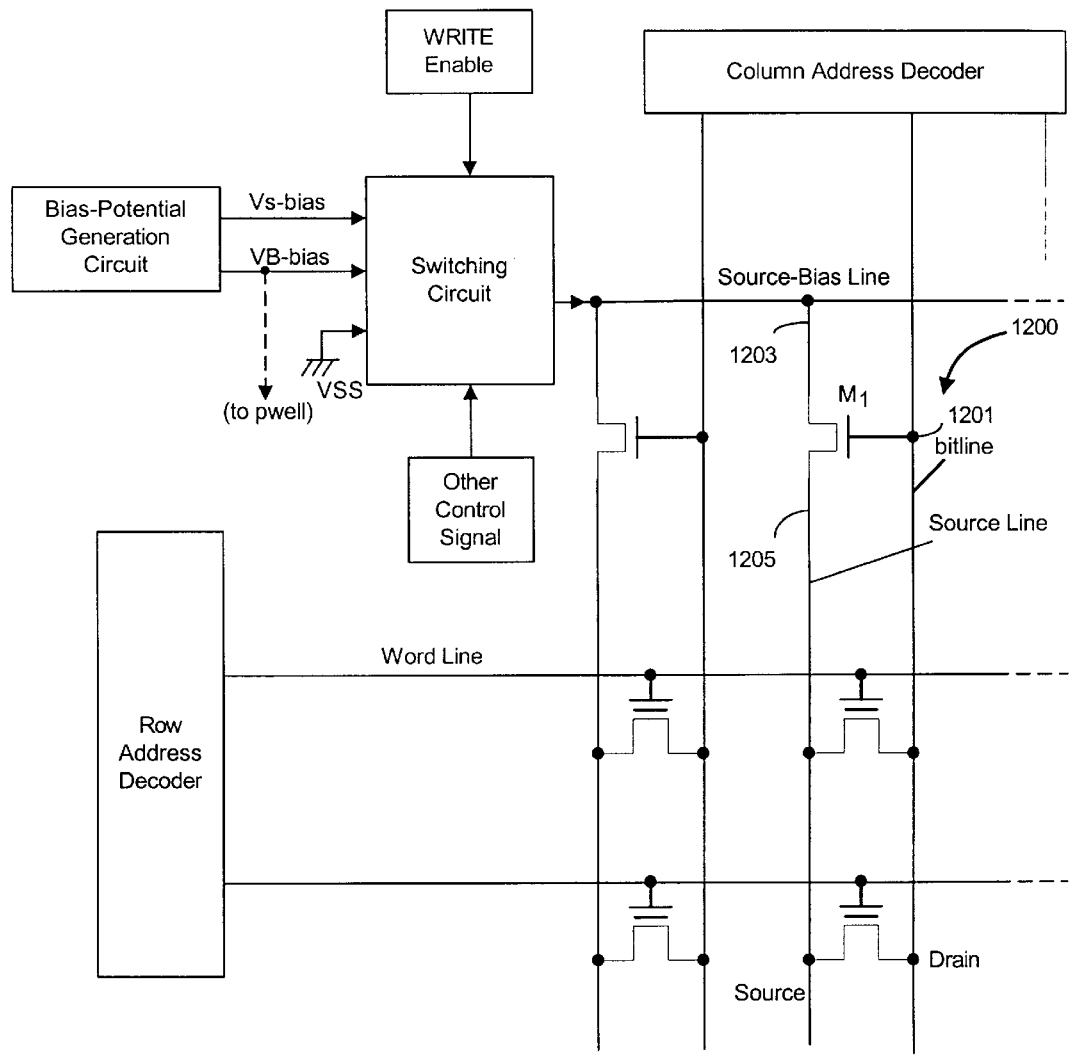

Referring to FIG. 10, a switch (e.g., MOS switch (M1)) 1200 couples between the source line 1205 and the source bias line 1203. The MOS switch has a first node connected to the source line and a second node connected to the source bias line. The MOS switch M1 is controlled by an adjacent bitline 1201, where the bitline connects to the gate of the MOS switch. When an adjacent bitline is at a higher-than Vt potential, as is the case during WRITE or READ operation, the source line is connected to the source-bias line. When the adjacent bitline is not at a higher-than-Vt potential, e.g., when said bitline is not selected during a READ or WRITE operation, the source line is not connected to the source-bias line. M1 can be at the same pwell potential as that of the memory cells. This way the forward junction leakage at the source junction is minimized or substantially reduced for memory cells connected to unselected bitlines.

Referring to FIG. 11 in an alternative embodiment, when two adjacent bitlines (bitline1 1303 and bitline2 1301) share the same source line 1305 for two adjacent arrays (columns) of memory cells, a logic operation (e.g., OR gate) 1307 can be used to let the two adjacent bitlines control the turn on of the MOS switch M1 1309. Here, the gate 1311 of the MOS switch connects to the output of the logic operation. The MOS switch has a first node 1313 connected to the source-bias line and a second node connected to the common source line. In operation for example, when either of the bitline1 or bitline2 is selected and at a potential higher than Vt of M1 during a WRITE or READ operation, the MOS switch is turned on, and the common source line is connected to the source-bias line. Alternatively, M1 can also be controlled by another control signal 1315 depending on the memory design and control methods.

While the above is a full description of the specific embodiments, various modifications, alternative constructions and equivalents may be used. For example, specific dimensions are discussed above for the specific embodiments. But of course, these dimensions may depend on the particular application. Therefore, the above description and illustrations should not be taken as limiting the scope of the present invention which is defined by the appended claims.

What is claimed is:

1. A method of operating a flash memory structure including a programming step, the method comprising:

providing a flash memory device, the flash memory device comprising a body of first conductivity type, a source region of second conductivity type being defined in the body and a drain region of second conductivity type defined in the body;

applying a drain voltage of first polarity type on the drain region and applying a control gate voltage of first polarity type on a control gate; and applying a source voltage of second polarity type ranging from about 0.1 volt to about 0.5 volt on the source region, while maintaining a ground potential on the body to inject electrons onto a floating gate, wherein the source voltage of second polarity type is applied by a bias-potential generation circuit coupled to the source region, the bias-potential generation circuit being coupled to the source region through a source-bias line.

2. The method of claim 1, wherein the first conductivity type is P-type conductivity and the second conductivity type is N-type conductivity.

3. The method of claim 1, wherein the first polarity type is positive polarity and the second polarity type is negative polarity.

4. The method of claim 1, wherein the body is a P-well provided within a substrate.

5. The method of claim 1 wherein the source region of second conductivity type and the drain region of second conductivity type are separated from each other by a channel region of about 0.6 micron or less.

6. The method of claim 1 wherein the source region of second conductivity type and the drain region of the second conductivity type are separated from each other by a channel region of about 0.35 micron or less.

7. The method of claim 1, further comprising:

providing a select gate adjacent to the floating and control gates; and applying a select gate voltage of first polarity type ranging from about 1 volt to about 2 volt while applying the source voltage of second polarity type, wherein the select gate, the control gate, and the floating gate define a split gate flash memory cell structure.

8. The method of claim 1 wherein the control gate is defined overlying the floating gate to define a stacked gate flash memory cell structure.

9. The method of claim 1 wherein the programming speed is proportional to a channel current of the memory cell, the channel current being proportional to $(V_{FG}-V_T)^2$ during programming, where $V_{FG}$ is potential of the floating gate and $V_T$ the threshold voltage, the method further including:

lowering the $V_T$ so that the channel current increases in response to the decrease of $V_T$, whereby the programming speed increases in response to the increase of channel current.

10. A method for programming a flash memory device in a memory array, wherein the memory array includes a plurality of flash memory devices, each of the flash memory devices being coupled to a column address decoder and a row address decoder, each of the flash memory devices also being coupled to a source bias line, the source bias line being coupled to a bias potential generation circuit, each flash memory device being defined within a well of first conductivity type, where each flash memory device includes a source region of second conductivity defined within the well, a drain region of second conductivity type defined within the well, a control gate provided between the source and drain regions, a floating gate provided adjacent to the control gate, the method comprising:

selectively applying a drain voltage of first polarity type on the drain region;

applying a control gate voltage of first polarity type on the control gate of at least one of the flash memory devices; and applying a source voltage of second polarity type on the source region on the at least one flash memory device, while applying a well potential of second polarity type on the well, wherein the source voltage of second polarity type is applied by the bias-potential generation circuit coupled to the source region, the bias-potential generation circuit being coupled to the source region through the source-bias line, wherein the source voltage of second polarity type is different than the well potential of second polarity type, the source voltage being greater than the well potential by no more than about 0.5 volts in absolute term.

11. The method of claim 10, wherein the bias potential generating circuit is coupled to the source bias line through a logic circuit.

12. The method of claim 11, wherein the logic circuit comprises an OR gate coupled to an MOS switch to apply the source voltage of second polarity type.

13. The method of claim 11, wherein the logic circuit comprises an MOS switch to selectively apply the source voltage of second polarity type to at least one of the flash memory devices.

14. The method of claim 10, wherein the first conductivity type is P-type conductivity and the second conductivity type is N-type conductivity.

15. The method of claim 10, wherein the first polarity type is positive polarity and the second polarity type is negative polarity.

16. The method of claim 10, wherein the drain voltage ranges from about 4 to about 12 volts of first polarity type, the control voltage ranges from about 1.5 to about 2.5 volts of first polarity type, the source voltage ranges from about 0.1 to about 0.5 volts of second polarity type, and the well potential is about 0 volt.

17. The method of claim 10, wherein the drain voltage ranges from about 1.1 volts to about 3.3 volts of first polarity type, the control voltage ranges from about 3 volts to about 5 volts of first polarity type, and the well potential ranges from about 0.5 volt to about 4 volt of second polarity type.

18. The method of claim 17, wherein the source voltage is of about 0.1 volt to about 0.5 volt more second polarity than the well potential.

19. The method of claim 10, wherein the well is the substrate of the memory array.

20. A method of operating a flash memory structure including a programming step, the method comprising:

providing a flash memory device, the flash memory device including a body of first conductivity type, source and drain regions of second conductivity type being defined within a portion of the body, a floating gate overlying the portion of the body, a control gate overlying the body, the source and drain regions being separated by a channel;

applying a drain voltage of first polarity type on the drain region;

applying a control voltage of first polarity type on the control gate; and applying a source voltage to the source region, so that potential of the source region is in second polarity relative to that of the portion of the substrate in order to reduce a threshold voltage and increase a channel current of the flash memory device.

21. The method of claim 20, wherein the source region is defined to inject electrons into a floating gate.

22. The method of claim 20, wherein the selected amount of the source voltage is of about 0.01 to about 0.65 volt greater magnitude in second polarity than the voltage being applied to the portion of the body.

23. The method of claim 22, wherein the selected amount of the source voltage is of about 0.2 to 0.5 volt greater magnitude in second polarity than the voltage being applied to the portion of the body.

24. The method of claim 20, wherein the first polarity type is positive polarity and the second polarity type is negative polarity, so that the source region is more negatively biased than the portion of the body.

25. The method of claim 20, wherein the control gate overlies the floating gate.

26. The method of claim 20, wherein the floating gate and the control gate are horizontally adjacent to each other.

* * * * *